(12) United States Patent
Chou et al.

(10) Patent No.: US 7,172,939 B1
(45) Date of Patent: Feb. 6, 2007

(54) METHOD AND STRUCTURE FOR FABRICATING NON VOLATILE MEMORY ARRAYS

(75) Inventors: Kai Cheng Chou, San Jose, CA (US); Harry Laun, Saratoga, CA (US); Kenlin Huang, Fremont, CA (US); J. C. Young, Milpitas, CA (US); Arthur Wang, San Jose, CA (US)

(73) Assignee: Winbond Electronics Corporation, Hsin-Chu (TW)

( * ) Notice: Subject to any disclaimer, the term of this patent is extended or adjusted under 35 U.S.C. 154(b) by 0 days.

(21) Appl. No.: 11/280,529

(22) Filed: Nov. 15, 2005

Related U.S. Application Data

(60) Provisional application No. 60/663,373, filed on Mar. 17, 2005.

(51) Int. Cl.
*H01L 21/336* (2006.01)
(52) U.S. Cl. ............... 438/257; 438/197; 257/E21.68; 257/E21.698
(58) Field of Classification Search ............... 438/197, 438/257; 257/E21.68, E21.688
See application file for complete search history.

(56) References Cited

U.S. PATENT DOCUMENTS

| | | | |
|---|---|---|---|
| 6,518,124 B1 * | 2/2003 | Ebina et al. | ............... 438/257 |
| 2003/0194841 A1 * | 10/2003 | Inoue et al. | ............... 438/257 |

\* cited by examiner

*Primary Examiner*—Long Tran

(74) *Attorney, Agent, or Firm*—Townsend and Townsend and Crew LLP

(57) ABSTRACT

An MONOS integrated circuit device. The device has a semiconductor substrate comprising a silicon bearing material and a shallow trench isolation region formed within the substrate. A P-type well region is formed within the substrate and adjacent to the shallow trench isolation region. The first word gate comprising a first edge and a second edge. The first word gate comprises a first control gate coupled to the first edge and a second control gate coupled to the second edge. Preferably, the second word gate comprises a first edge and a second edge. The second word gate comprises a first control gate coupled to the first edge and a second control gate coupled to the second edge. A common buried bit line is formed within the P-type well region and between the second edge of the first word gate and the first edge of the second word gate. An HDP plasma dielectric is formed overlying the common buried bitline to a height within a vicinity of a first surface of the first word gate and a second surface of the second word gate. In a preferred embodiment, the device has a planarized surface formed from a portion of the HDP plasma dielectric, the first surface, and the second surface. A word line is overlying the planarized surface. The word line is coupled to the first word gate and the second word gate and is overlying the HDP plasma dielectric. The device has a refractory metal layer formed overlying the word line, a hard mask layer overlying the refractory metal layer, and a cap layer formed overlying the hard mask layer. The word line, refractory metal layer, hard mask layer, and cap layer form a planarized structure.

17 Claims, 11 Drawing Sheets

METHOD AND STRUCTURE FOR FABRICATING NON VOLATILE MEMORY ARRAYS

This application claims benefit of 60/663,373, filed Mar. 17, 2005.

BACKGROUND OF THE INVENTION

The present invention relates generally to integrated circuit devices. More particularly, the invention provides a method and structure for a non-volatile memory device, commonly called a metal oxide-nitride-oxide on silicon ("MONOS") memory device. Merely by way of example, the present invention provides a method for processing a cell region of the MONOS memory separately while protecting peripheral regions of the device for efficiency and improvement in device characterization. The peripheral regions are then processed while protecting the cell region in other embodiments. Certain steps are performed to process both the peripheral and cell region for efficiency and improved process integration purposes.

Integrated circuits proliferated through the years. Certain types of integrated circuits include memory devices. The memory devices include volatile memories such as dynamic random access memory devices, commonly called "DRAMs" and non-volatile memory devices. The nonvolatile memory device is often capable of storing data when the power supply is turned off. An example of the non-volatile memory device is a Flash Memory Device. The Flash Memory Device includes a silicon floating polysilicon gate that stores electrical charges in the floating gate. Electrons are injected onto the floating gate by channel hot electron to program the Flash memory device. Such electrons are removed from the floating gate by a tunneling influence between the floating gate and the substrate. Other types of non-volatile memory devices also exist.

Another example of non-volatile memory device is a Metal Oxide Nitride Oxide Silicon memory, which is commonly termed "MONOS." The MONOS memory includes an MOS transistor in which the gate dielectric is a composite oxide-nitride-oxide layer. Electrons are introduced by hot electron injection into the ONO gate dielectric and stored in traps in the nitride layer of the ONO gate dielectric to program the device. The electrons are removed from the traps by a tunnel-assisted hot hole injection process. In a certain type of MONOS memory, the electrical charges are stored in traps separately at each of the edges of the transistor gate, resulting in two bits of storage in a single memory transistor.

An improved MONOS memory device incorporates two additional control gates, i.e., one at each side of the transistor gate. An example of such improved MONOS device as shown in FIG. 1, which is two bits per cell twin MONOS memory device proposed by Halo LSI Design & Device Technology, Inc. As can be seen in FIG. 1, memory cell 100 includes two control gates 20 and 30 formed on either side of the word gate 14. Insulating layer 24 separating control gate 20 from the word gate 14 and the substrate is the oxide-nitride-oxide layer where charges will be stored in the memory device. Another insulating layer 26 separates control gate 30 from the word gate 14 and the substrate. Other integrated circuit device elements are also included. That is, impurity layers form the source and drain regions of this memory device. Two MONOS elements are formed in memory device 100 and are controlled separately by control gates 20 and 30. The MONOS device also includes word gate and buried bit line implant. Fabrication of this type of MONOS device has many challenges, such as spacer etch to form the control gates, diffusion bit line isolation, contact formation, word line formation, and integration of the cell area and the peripheral area, etc. Therefore, there is a need for an improved method for fabricating the twin MONOS memory device.

From the above, it is seen that improved manufacturing techniques for MONOS memory devices are desirable.

SUMMARY OF THE INVENTION

According to the present invention, techniques for fabricating integrated circuit devices are provided. More particularly, the invention provides a method and structure for a non-volatile memory device, commonly called a metal oxide-nitride-oxide on silicon ("MONOS") memory device. Merely by way of example, the present invention provides a method for processing a cell region of the MONOS memory separately while protecting peripheral regions of the device for efficiency and improvement in device characterization. The peripheral regions are then processed while protecting the cell region in other embodiments. Certain steps are performed to process both the peripheral and cell region for efficiency and improved process integration purposes.

In a specific embodiment, the present invention provides a method for forming a memory device, e.g., non-volatile memory device, MONOS memory device. The method includes providing a substrate (e.g., silicon wafer) comprising a surface region. The method includes forming well structure within the substrate. The well structure includes a cell well region for a plurality of cell regions and a peripheral well region for a peripheral region. The method includes forming a gate dielectric layer (e.g., gate oxide, nitride, silicon oxynitride) overlying the surface region, which extends over the cell well region and the peripheral well region. The method also includes forming polysilicon film overlying the gate dielectric layer overlying the well structure.

In a specific embodiment, the method performs other steps. In particular, the method includes forming cap layer overlying the polysilicon film and selectively removing a portion of the cap oxide layer overlying the cell regions to expose the polysilicon film overlying the cell regions while maintaining the cap layer on the peripheral region. A blanket nitride layer is formed overlying the cap layer and exposed cell region. A plurality of word gates are formed by patterning the polysilicon film in the cell region while using a portion of the nitride layer as a hard mask while exposing a portion of the surface of the substrate between each of the word gates. The method also forms an oxide-on-nitride-on oxide layer overlying the word line and exposed portion of the surface of the substrate between each of the word gates. The method forms a pair of polysilicon sidewall spacers on each word gate to form a pair of control gates while each pair of control gates is being isolated electrically from the word line by a portion of the oxide-on-nitride-on-oxide layer. Each of the control gates also is overlying a portion of the oxide-on-nitride-on oxide. The method includes forming cell lightly doped drain (i.e., LDD) structures for each of the control gates and forming a buried bit line structure within a portion of the substrate for each of the LDD structures. A dielectric layer is formed overlying regions within each of the word gate structures. This dielectric layer is patterned with a reverse mask—the reverse of the poly gate mask used—such that the dielectric remains only in the gap between the control gates. The method next planarizes the dielectric layer by chemical mechanical polishing and wet etch. The method then forms word lines by removing the nitride layer overlying the cell region, depositing the word line stack layer comprising a polysilicon layer and a silicide layer, and pattern the word line stack layer to form word lines. Next, the method protects the cell regions and processes the peripheral region while maintaining the protection on the cell region.

In an alternative specific embodiment, the present invention provides a method for forming integrated circuits using a reverse masking process. The method includes providing a substrate (e.g., silicon) comprising a surface region. The method includes forming a cell region and a peripheral region on the surface region of the substrate and forming a gate dielectric layer overlying the cell region and the peripheral region. The method includes forming a gate layer overlying the gate dielectric layer and forming a protective layer overlying the peripheral region. A plurality of memory cell devices are formed in the memory cell region. Each of the memory cell device includes a word gate coupled to a pair of control gates. Each of the word gates has a capping layer thereon. Each of the control gates has a height lower than a surface of the capping layer. The method includes forming an interlayer dielectric (e.g., oxide) using high density plasma overlying an entirety of the surfaces including peripheral region and cell region to a height above the surface of the capping layer. The method also includes forming a protective layer overlying the interlayer dielectric layer portion overlying the cell region while exposing the peripheral region and removing the exposed portion of the interlayer dielectric layer in the peripheral region to cause a step difference in height of a cell surface region of the cell region and a peripheral surface region of the peripheral region. The method performs a chemical mechanical polishing process to remove a portion of the interlayer dielectric layer overlying the cell region. The method maintains the chemical polishing process until the capping layer on each of the gates has been exposed and until a recessed region between a pair of capping layers on respective word gates has been formed. The method selectively removes the capping layer from each of the word gates to expose the word gates and forms a conductive layer overlying each of the word gates.

In yet an alternative specific embodiment, the present invention provides an NMOS integrated circuit device. The device has a semiconductor substrate comprising a silicon bearing material and a shallow trench isolation region formed within the substrate. A P-type well region is formed within the substrate and adjacent to the shallow trench isolation region. A first word gate is formed on the P-type well region. The first word gate comprises a first edge and a second edge. The first word gate comprises a first control gate coupled to the first edge and a second control gate coupled to the second edge. A second word gate is formed on the P-type well region. Preferably, the second word gate comprises a first edge and a second edge. The second word gate comprises a first control gate coupled to the first edge and a second control gate coupled to the second edge. A common buried bit line is formed within the P-type well region and between the second edge of the first word gate and the first edge of the second word gate. An HDP plasma dielectric is formed overlying the common buried bitline to a height within a vicinity of a first surface of the first word gate and a second surface of the second word gate. In a preferred embodiment, the device has a planarized surface formed from a portion of the HDP plasma dielectric, the first surface, and the second surface. A word line is overlying the planarized surface. The word line is coupled to the first word gate and the second word gate and is overlying the HDP plasma dielectric. The device has a refractory metal layer formed overlying the word line, a hard mask layer overlying the refractory metal layer, and a cap layer formed overlying the hard mask layer. The word line, refractory metal layer, hard mask layer, and cap layer form a planarized structure.

Depending upon the embodiment, the present invention may achieve one or more of these benefits over conventional processing techniques. These benefits have been provided below.

(1) A fabrication process that forms memory cell array first, while peripheral poly is protected by an oxide layer to protect peripheral poly from later word line (WL) etch. After word gate (WG) deposition in our present flow, cap oxide is used to protect peripheral poly against a later WL etch, which stops on oxide. In the memory cell area, however, oxide is removed by a cell mask. The word gate is thereafter formed after SiN layer is deposited. As mentioned before, during WG etch, the peripheral poly is protected. Such a memory first process provides an ability to develop and possibly optimize the memory cells first without affecting peripheral logic transistor architecture.

(2) The buried bit line (BL) formation uses a high density plasma (HDP) oxide layer, and includes a reverse mask to remove oxide on peripheral region, which has logic circuitry. After WG formation, while peripheral poly has been protected, many processes including control gate (CG) channel implant, oxide-on-nitride (ONO)/CG poly deposit and etch, cell LDD, oxide spacer, and BL implant are provided to make a functional memory cell transistor. Afterward, oxide-fill in-between BLs is provided for isolation. As device dimension shrinks, a gap fill oxide deposition process is needed to fill the narrow BL spacing. Preferably, high density plasma oxide has been used. A reverse mask is then employed to clear peripheral area oxide first before BL oxidation oxide chemical mechanical polishing, commonly called CMP. Such approach provides an advantage of shorter process time, better process control, and wider process window, among other possible benefits. Chemical Mechanical Polishing technology has certain oxide to SiN selectivity such that minor surface morphology (i.e., shallow trench isolation (STI) edge) may pose a problem for complete oxide removal without additional wet process after CMP. By using this embodiment of the invention, the additional wet recess process after the word gate, CMP could be used to optimize BL oxide recess specifically. Such BL oxide recess is often important or even critical for preventing shortage between nodes (e.g., WL, CG, WG).

(3) Simultaneous contact formation for WL, buried BL, logic gate and logic S/D. A practical manufacturing contact scheme is often a challenge for the buried diffusion BL cell architecture, since BL has been sealed by HDP oxide in a relatively early stage of the process and a relatively high contact aspect ratio. According to a preferred embodiment of the present invention, we adopted the scheme to form four different contacts simultaneously, with a single step. As shown below, four contacts includes WL (with biggest step high), BL contact, logic gate contact, and logic S/D contact (with deepest aspect ration (A.R.)). Simultaneous contact formation often saves process steps and mask counts according to preferred embodiments.

As noted, numerous benefits may be achieved using the present invention over other techniques. For example, the present invention provides an efficient way to optimize the cell region structures independently from the peripheral region structures. The cell region structures will include the MONOS memory devices. The peripheral region structures will include logic transistors. In other embodiments, the invention may use convention process technology for efficiency and reliability. One or more of these benefits may be achieved depending upon the embodiment. These and other benefits are described throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
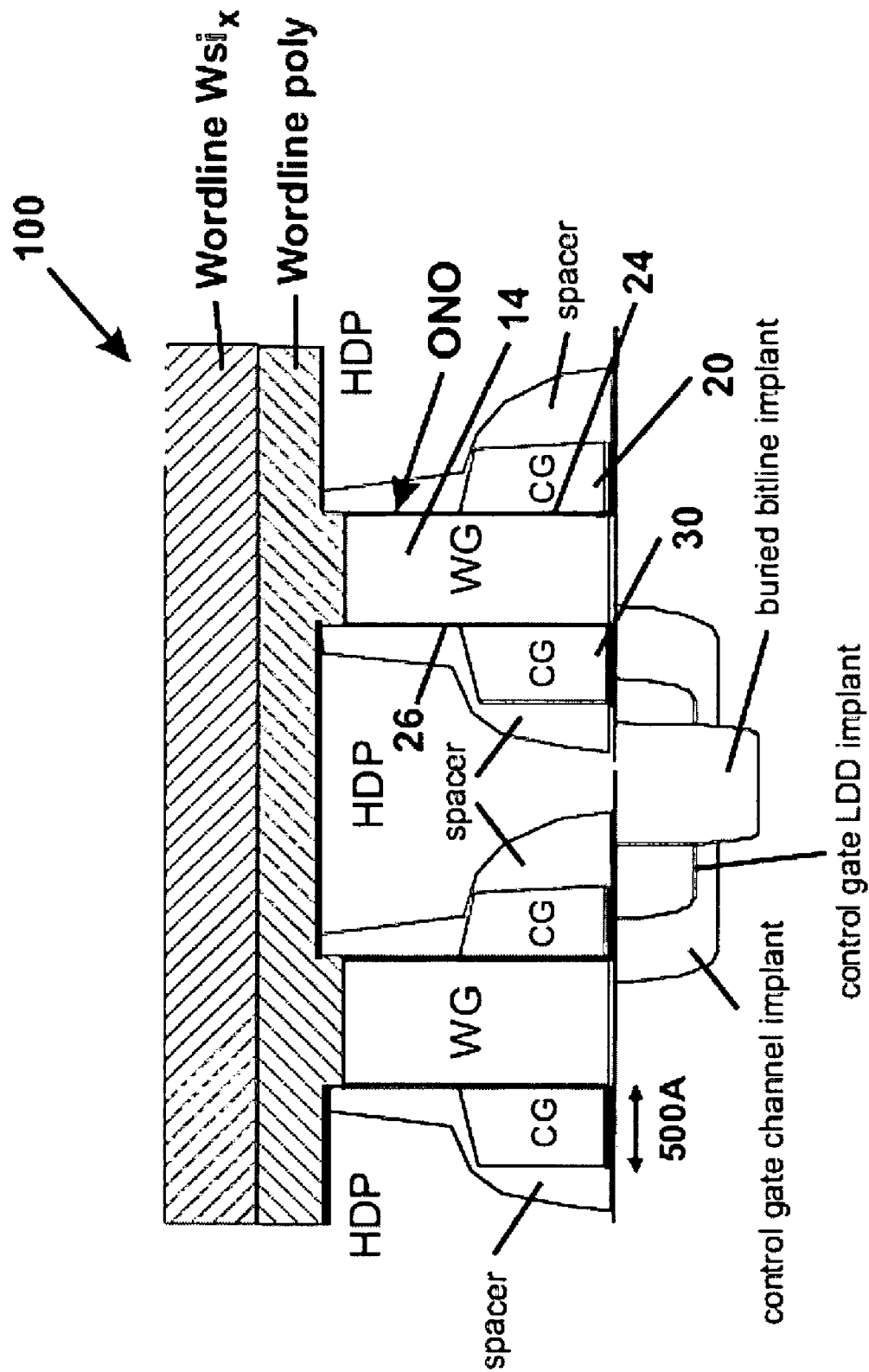
FIG. 1 is a simplified cross-sectional view diagram of a twin MONOS device according to an embodiment of the present invention.
Figure 2:
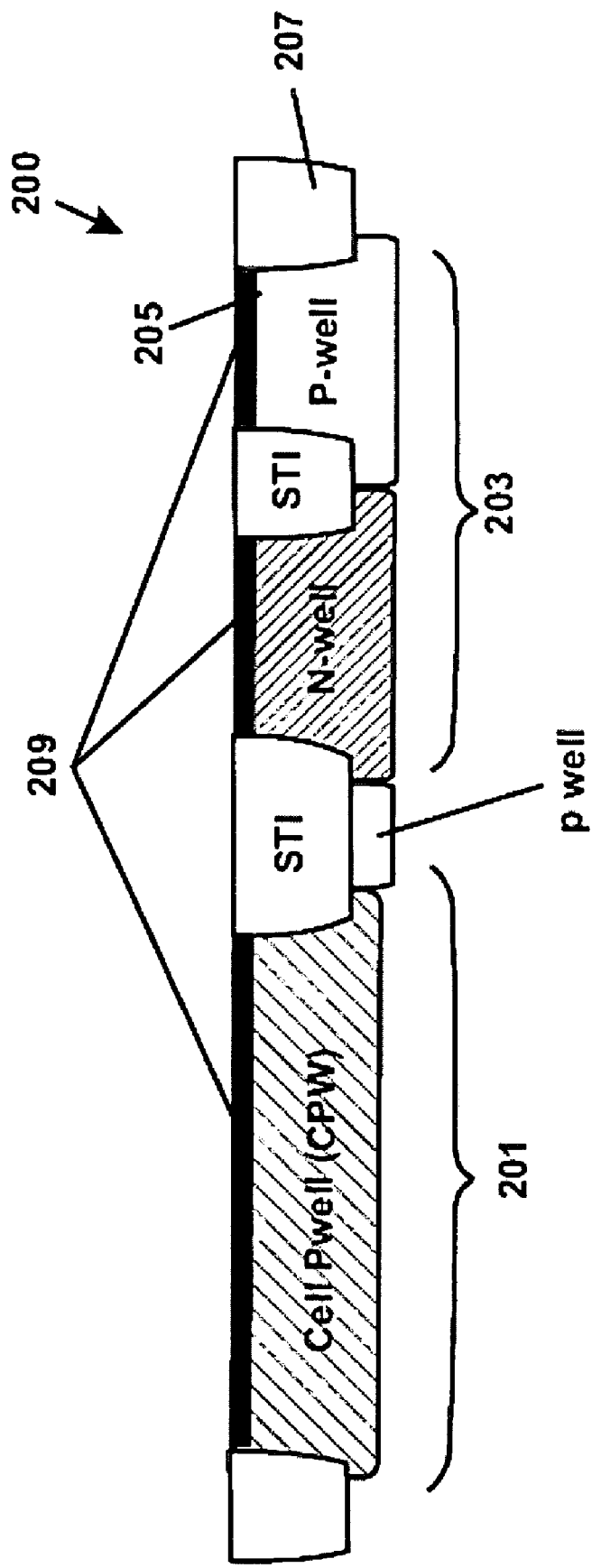
FIGS. 2 through 10 are simplified drawings illustrating a method for fabricating a non-volatile memory according to embodiments of the present invention.

According to the present invention, techniques for fabricating integrated circuit devices are provided. More particularly, the invention provides a method and structure for a non-volatile memory device, commonly called a metal oxide-nitride-oxide on silicon ("MONOS") memory device. Merely by way of example, the present invention provides a method for processing a cell region of the MONOS memory separately while protecting peripheral regions of the device for efficiency and improvement in device characterization. The peripheral regions are then processed while protecting the cell region in other embodiments. Certain steps are performed to process both the peripheral and cell region for efficiency and improved process integration purposes.

Depending upon the embodiment, the present invention includes various features, which may be used. These features include the following:

1. Buried BL formation including using an HDP oxide layer and using a reverse mask to remove oxide on peripheral region.
2. A fabrication process that forms memory cell array first, while peripheral poly is protected by an oxide layer to protect peripheral poly from later word line ("WL") etch.
3. Simultaneous contact formation for WL, buried BL, logic gate and logic S/D.

As shown, the above features may be in one or more of the embodiments to follow. These features are merely examples, which should not unduly limit the scope of the claims herein. One of ordinary skill in the art would recognize many variations, modifications, and alternatives.

A method for fabricating an integrated circuit device according to an embodiment of the present invention may be outlined as follows:

1. Provide substrate, e.g., silicon wafer;
2. Form active area within the substrate;
3. Form well regions including cell region and peripheral region;
4. Form gate oxide region;
5. Form polysilicon layer for word gates and logic gates;
6. Form cap oxide layer;
7. Pattern cap oxide layer to expose cell region;
8. Form nitride layer (e.g., blanket overlying entirety of exposed surfaces of the substrate) overlying exposed cell region and cap oxide layer;
9. Pattern exposed polysilicon layer to form word gates and expose regions of the substrate between each of the word gates;
10. Form oxide-on-nitride-on oxide layer overlying word gates and exposed regions of the substrate;
11. Form blanket polysilicon layer overlying the oxide-on-nitride on oxide layer;
12. Pattern the blanket polysilicon layer to form control gates on each of the word gates;
13. Form lightly doped drain regions;
14. Form spacer region on sides of the control gates;
15. Form buried bit line region within the substrate;
16. Deposit HDP oxide overlying cell region to form interlayer dielectric layer in the cell region;
17. Pattern the HDP oxide layer with a reverse mask—the reverse of the poly gate mask used in step 9—to remove HDP oxide such that HDP remains only in the gap between the control gates;
18. Planarize the HDP oxide layer by chemical mechanical polishing and wet etch;
19. Remove the nitride layer overlying the cell region;
20. Deposit the word line stack consisting of polysilicon layer and a silicide layer;
21. Pattern the word line stack layer to form word lines;
22. Remove the cap oxide layer overlying the nitride layer over the peripheral region;
23. Pattern the polysilicon layer to form logic gates in the peripheral region;
24. Form the source and drain of the logic transistors in the peripheral region.

The above sequence of steps provides a method according to an embodiment of the present invention. As shown, the method uses a combination of steps including a way of forming a non-volatile memory device according to embodiments of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 10 are simplified drawings illustrating a method for fabricating a non-volatile memory according to embodiments of the present invention. These diagrams are merely examples, which should not unduly limit the scope of the claims herein. One of ordinary skill in the art would recognize many variations, alternatives, and modifications. As shown, the method includes providing a substrate (e.g., silicon wafer) 200 comprising a surface region 205. The method includes forming adequate well structures within the substrate. The well structures include a memory cell well region 201 for a plurality of cells and a peripheral well region 203 for a peripheral region. The cell well region is preferably a P-type well.

Referring again to FIG. 2, the P-type well includes boron based impurities or the like. Proper isolation region 207 (e.g. shallow trench isolation) are formed for devices isolation. The peripheral region includes P-type and N-type wells. Depending upon the application, the peripheral region can include other types of well structures. Additionally, the peripheral region may not be located in the peripheral region in a special manner but has been indicated as "peripheral" as definition. The method includes forming a gate dielectric layer 209 (e.g., gate oxide, nitride, silicon oxynitride) overlying the surface region, which extends over the cell well region and the peripheral well region as also shown. The gate oxide is often formed using a thermal oxidation process to form high quality gate oxide, which is free from voids, etc. Proper gate dielectric layer thicknesses are often required for devices to operate at different voltages. Depending upon the embodiment, there can be other variations, modifications, and alternatives.

Figure 3:
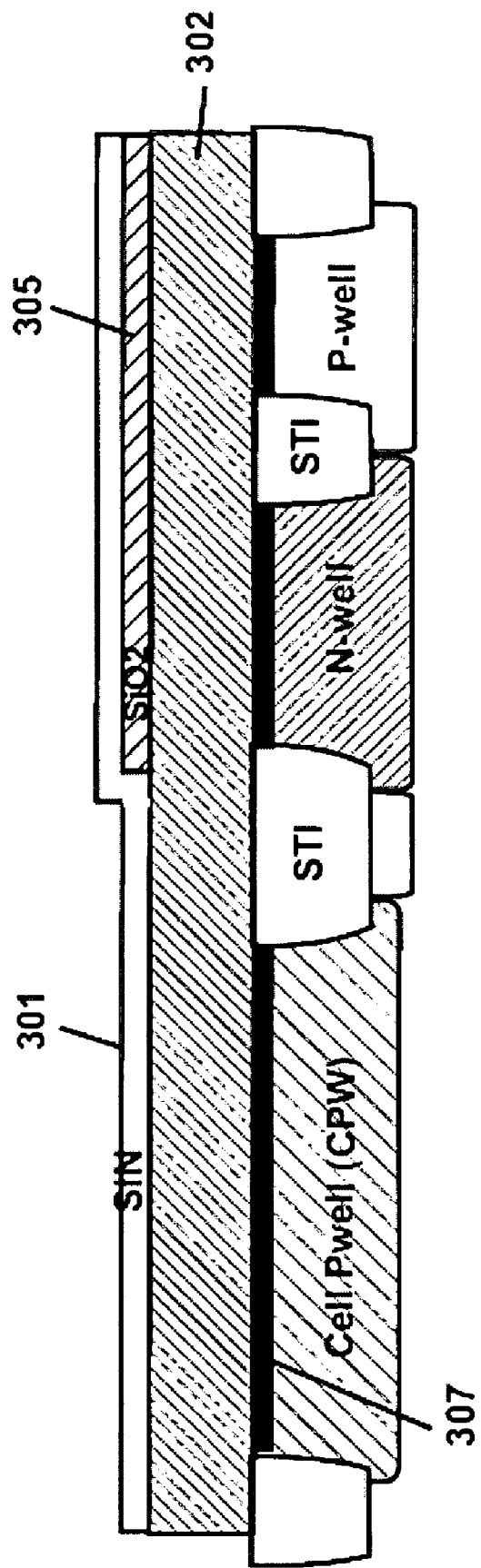

Referring to FIG. 3, the method also includes forming polysilicon film 302 overlying the gate dielectric layer overlying the structures underlying the gate dielectric layer. The polysilicon film is preferably for both logic gates for peripheral cell transistors in the peripheral region and word line gates for the memory cell transistors in the memory cell region. The film is often doped using impurities to provide conductive characteristics. The film can be doped using diffusion and/or in-situ doping techniques of phosphorus bearing impurities, e.g., phosphine. The film can be a single layer or multiple layers of different materials, depending upon the embodiment.

Referring again to FIG. 3, the method includes forming etching stop cap layer 305 overlying the polysilicon film and selectively removing a portion of the cap oxide layer overlying the cell regions to expose the polysilicon film. Such etching stop layer (e.g., SiO2) serves the purpose of protecting peripheral polysilicon during the word line etching process. A blanket nitride layer 301 is formed, thereafter, overlying the cap layer and the exposed cell region 307. Here, a purpose of the nitride layer is to protect polysilicon during buried bit line oxide chemical mechanical polishing process, which will follow according to a specific embodiment. While the peripheral region has been protected using the cap oxide layer and nitride layer, the cell region undergoes processing, which will be described in further detail throughout the present specification and more particularly below.

Figure 4:
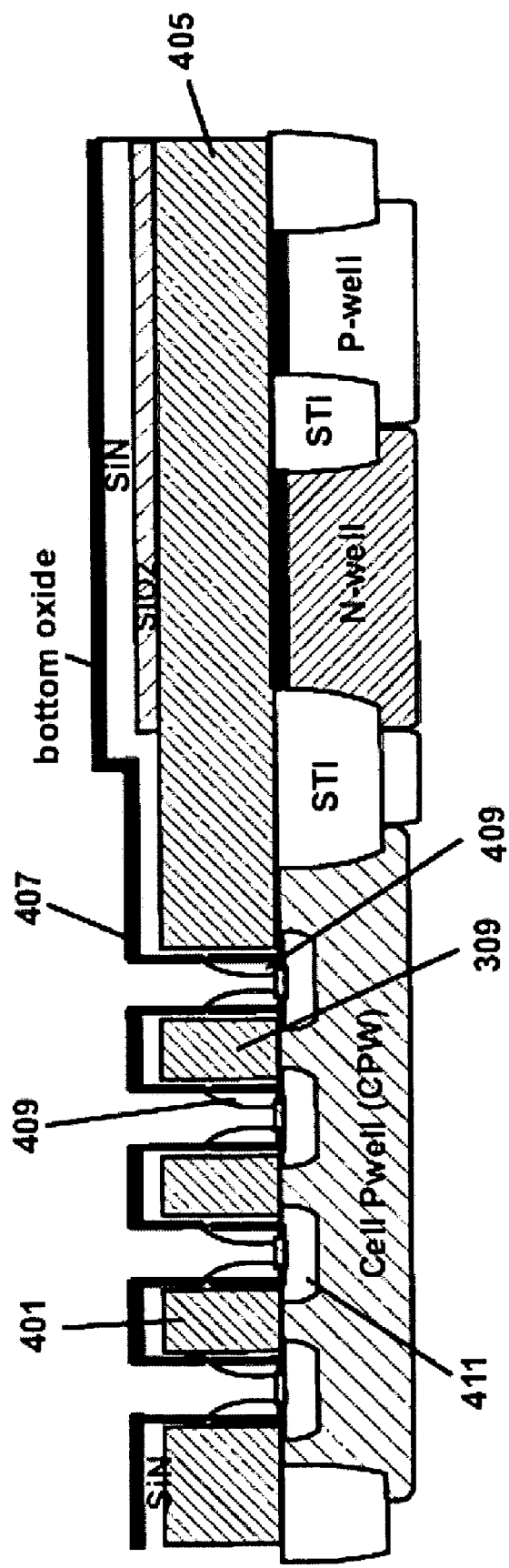

The method forms word gates in the cell region, as illustrated by FIG. 4. Here, a plurality of word gates 401, 309 are formed by patterning the polysilicon film in the cell region while using a portion of the nitride layer as a hard mask and while exposing a portion of the surface of the substrate between each of the word gates. During the etching step, polysilicon material 405 in the peripheral region has been protected. Such approach allows for optimizing and/or improving memory cell devices independently from peripheral cell devices according to a preferred embodiment. Memory cell optimization is desirable for memory (e.g., Flash) technology and fabrication. After the word gate poly etch, a control gate (CG) channel implant 411 is performed. The implant is performed to provide desirable characteristics to the memory cell devices.

The method also forms an oxide-on-nitride-on-oxide (ONO)layer 407 overlying the word gate polysilicon. Thereafter, a thin layer of polysilicon, but not limited to polysilicon, is deposited on top of ONO. Polysilicon etch-back, stop on top oxide, is then performed to form a pair of polysilicon sidewall spacers 409 on each word gate to form a pair of control gates (CG) while each pair of control gates is being isolated electrically from the word line by a portion of the oxide-on-nitride-on-oxide layer. ONO is then removed, regions not covered by control gate ("CG") poly, with only bottom oxide remaining and acts as a stop layer according to preferred embodiments. As shown, each of the control gates also is overlying a portion of the oxide-on-nitride-on oxide on edges of the word gate and substrate surface.

Figure 5:
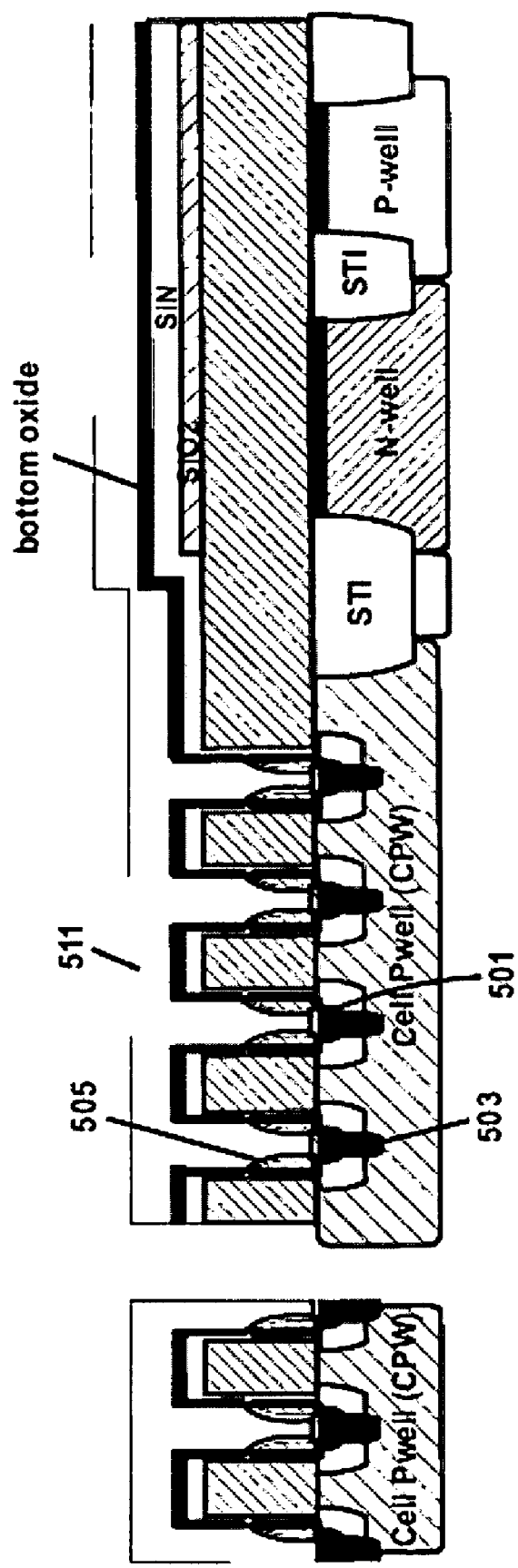

The method includes forming cell lightly doped drain ("LDD") structures 501 for each of the control gates, as shown in FIG. 5. The LDD implant has a concentration of phosphorus impurities ranging from about 1E13 atoms/centimeter$^3$ to about 5E13 atoms/centimeter$^3$ according to preferred embodiments. After the memory cell LDD implant, dielectric layer 505 (e.g., oxide) is deposited, and etched back to form a spacer. Next, the method forms a bit line structure 503. Preferably, a buried bit line is formed by N+ type dopant impurities using implantation processes. During BL implant, the peripheral region has been protected using the capping layer and nitride layers. The buried bit line is preferably formed using arsenic_impurities having a concentration ranging from about 3E15 atoms/centimeter$^3$ to about 5E15 atoms/centimeter$^3$ according to a preferred embodiment.

Figure 6:
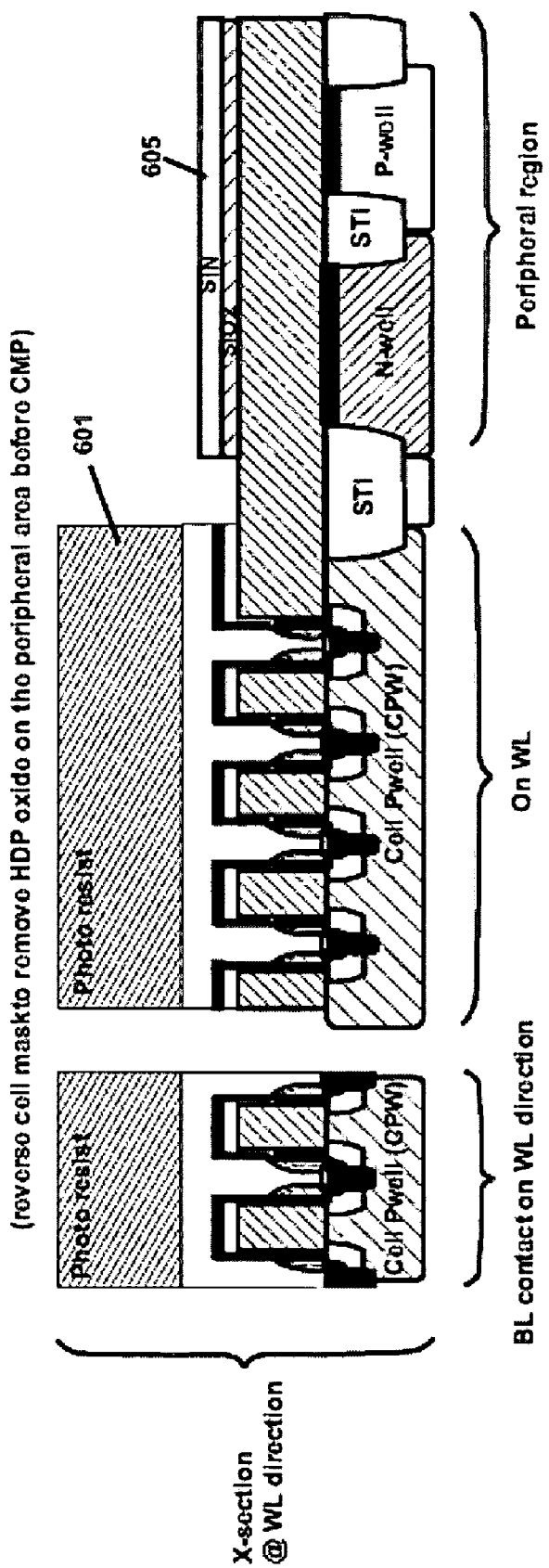

An interlayer dielectric 511 is formed overlying regions within each of the word gate structures, as shown in FIG. 5. Such interlayer dielectric, HDP oxide in this case but not limited to high density plasma, commonly called HDP oxide, is formed by depositing a thick oxide layer, and polished back to stop on top of nitride. Purpose of this oxide is to serve as a isolating layers in-between word gates. Before the process of polishing back by CMP (Chemical Mechanical Polishing) process, the interlayer dielectric on the peripheral region has been removed by a reverse mask 601, as illustrated by FIG. 6. The mask protects the cell region while allowing the silicon nitride layer 605 to be exposed.

Figure 7:
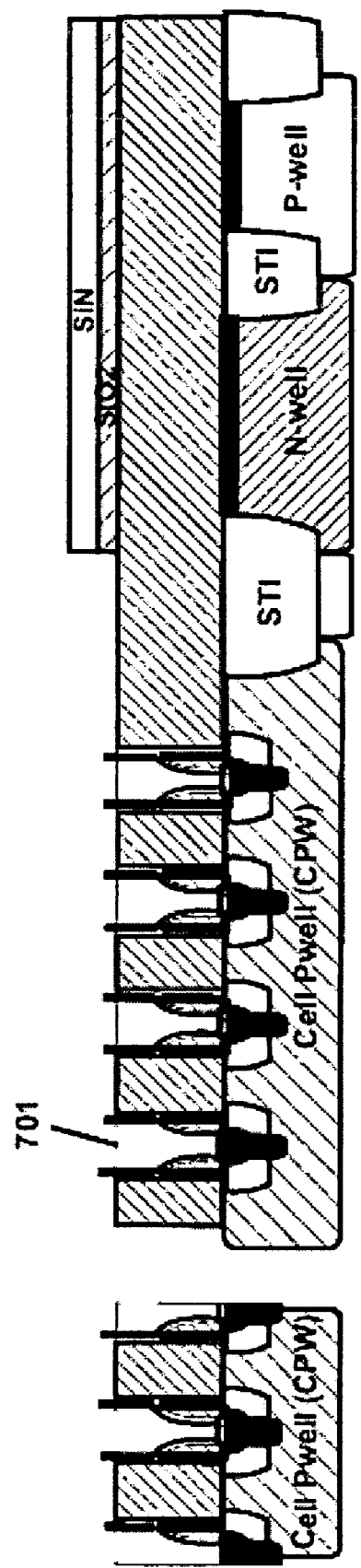
Figure 8:
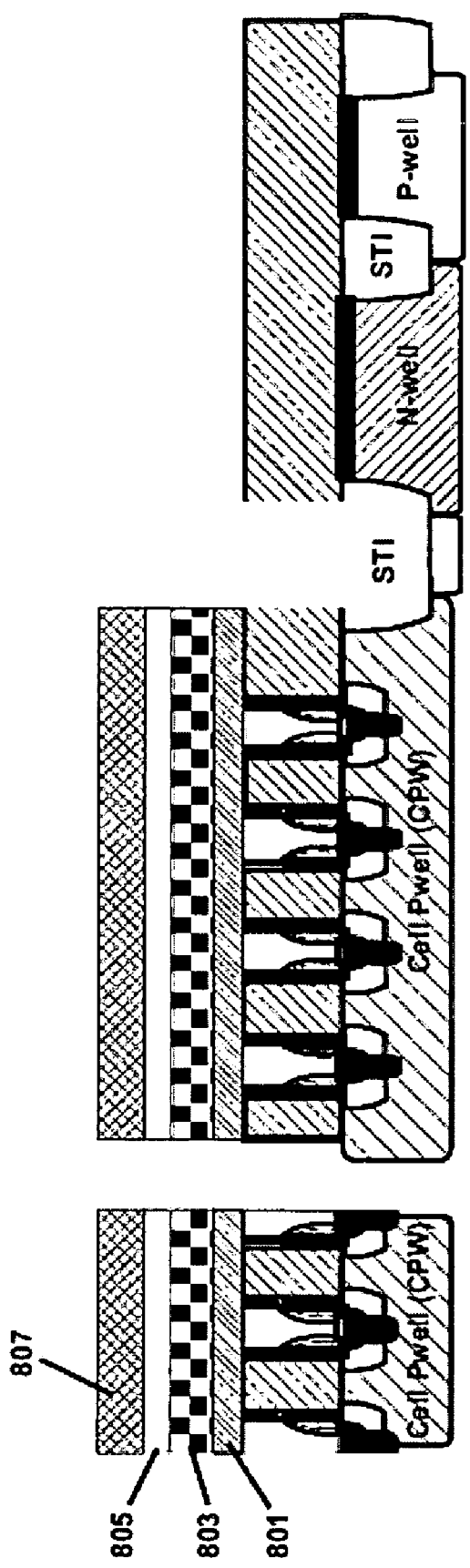

The present reverse mask approach in the fabrication process saves on cycle time, and provides an extra degree of freedom to optimize oxide recess in-between word gates. Referring to FIG. 7, the method performs the CMP process on the HDP oxide layer. The HDP oxide CMP process and wet etch process in preferred embodiments provides an oxide region 701 overlying the control gate structures. Controlling such oxide region is desirable for the yield of resulting devices. As shown, the CMP process stops on the top of the nitride on the top of the word gates. The remaining silicon nitride (SiN) on top of word gate poly is removed after CMP process, as illustrated by FIG. 8.

Referring again to FIG. 8, the method includes forming a conducting layer 801 on top of word gates, to connect all the word gates together. A composite of multiple films are used in preferred embodiments. The method deposits a refractory metal layer 803 overlying the conducting layer, which is polysilicon. Tungsten silicide (WSix) acts as the main conducting layer, yet it should not be limited to tungsten silicide in other embodiments. Nitride or oxide or a combination 805, 807 of both could be used as well on top of WSix as a hard mask for better critical dimension control. Word lines are then defined by patterning and etching such conducting layer. Preferably, the method prevents shortages between word lines. During word lines etching, peripheral polysilicon has been protected by the oxide deposited in earlier steps. After memory cell word lines etching has been performed, the protection oxide on top of peripheral poly region is removed such that the peripheral region can be processed. These process steps are described throughout the present specification and more particularly below.

Figure 9:
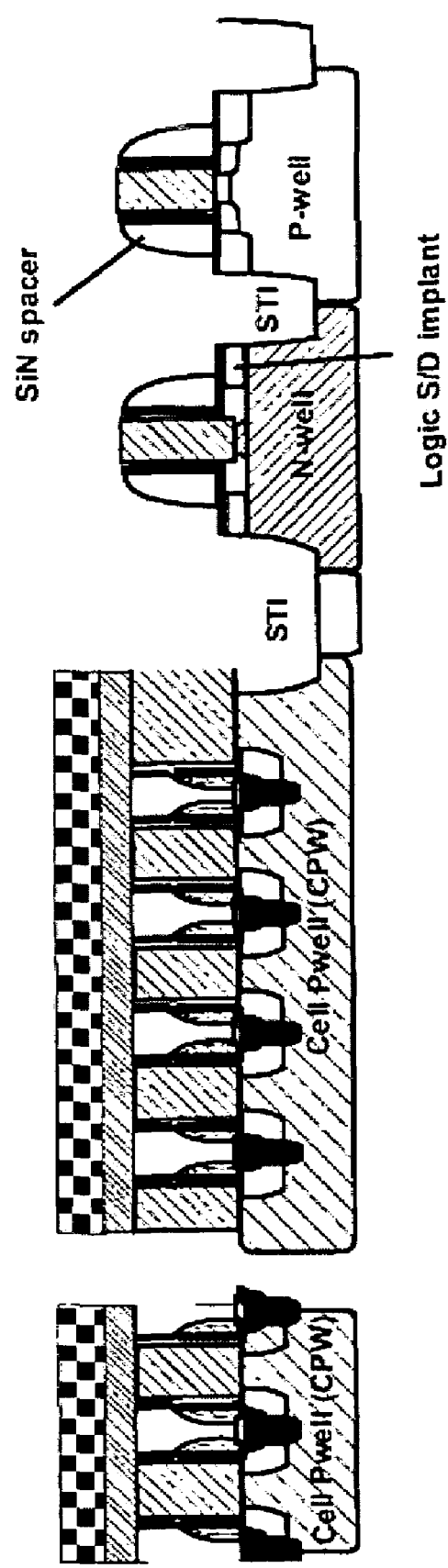

Referring to FIG. 9, the method includes forming peripheral transistor gates by peripheral polysilicon reactive ion etching, while the memory cell region has been protected, as shown. After gate formation, typical logic transistor source/drain (S/D) formation processes are performed. Here, the method forms source/drain regions, sidewall spacers, and other common transistor elements. Of course, one of ordinary skill in the art would recognize other variations, modifications, and alternatives.

Figure 10:
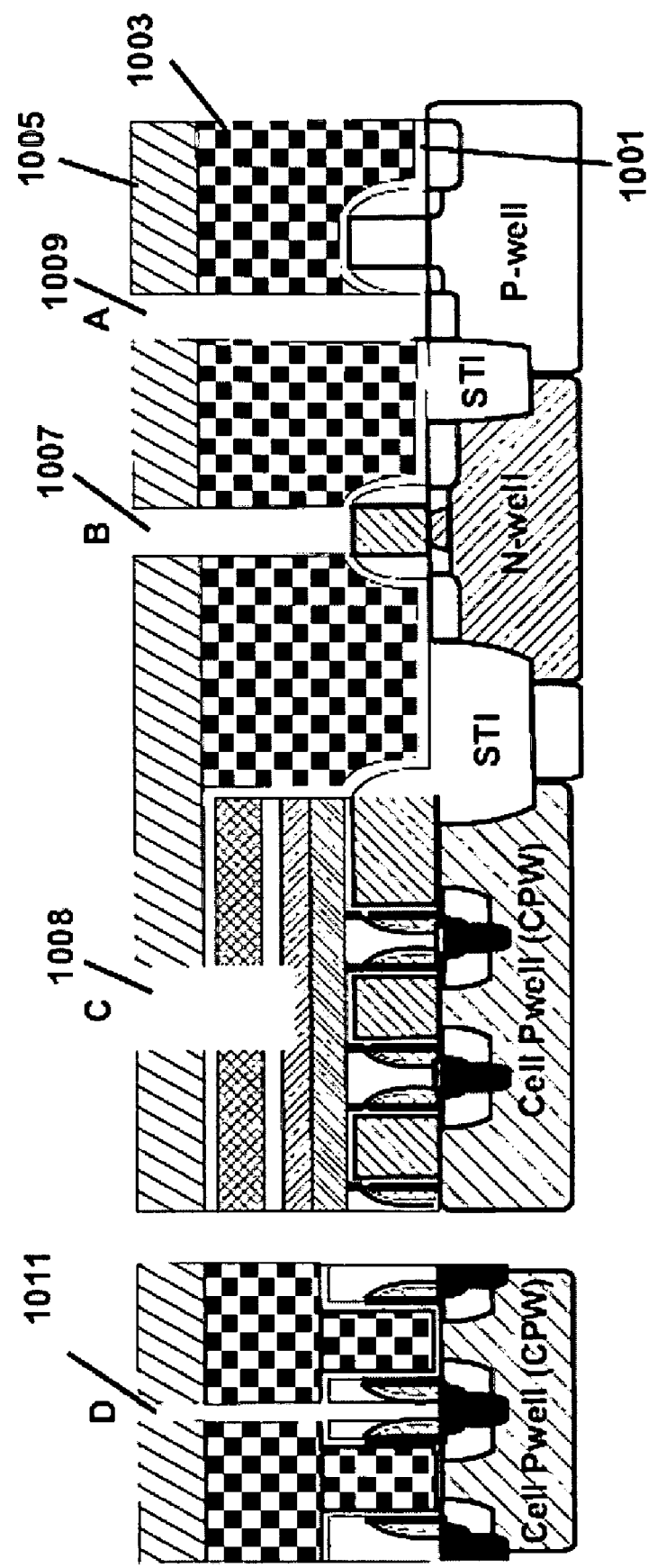

A nitride barrier layer 1001 is then deposited before pre-metal dielectric layer (PMD) as shown in FIG. 10. The nitride layer conforms to the surface topography of the transistor elements. The method also includes forming pre-metal dielectric layer 1003 (PMD) by depositing a doped oxide layer, BPSG in this case yet not limited to BPSG, and polished back to form a planarized layer structure. As a typical process, such a doped oxide layer is capped by an undoped oxide 1005 for better film stability. Depending upon the embodiment, there can be other variations, modifications, and alternatives.

Referring again to FIG. 10, contact regions 1009, 1007, 1008, 1011 are formed after on selected or all nodes simultaneously as shown for lower costs and shorter cycle time. According to preferred embodiments, contacts include word line contact, buried bit line contact, peripheral transistor gate polysilicon contacts and source/drain contacts. Preferably, the contact openings are formed for these four different regions simultaneously although step height differences exist between wordlines in memory cell region and source drain regions for peripheral logic devices, and the use of buried nitride. Buried nitride makes the contact opening on buried bitline in memory region difficult due to the nitride punch through step during oxide etch. After forming contact holes, conductive contact layer, tungsten in this embodiment yet not limited to, and interconnect layers are fabricated using process flow.

Figure 11:
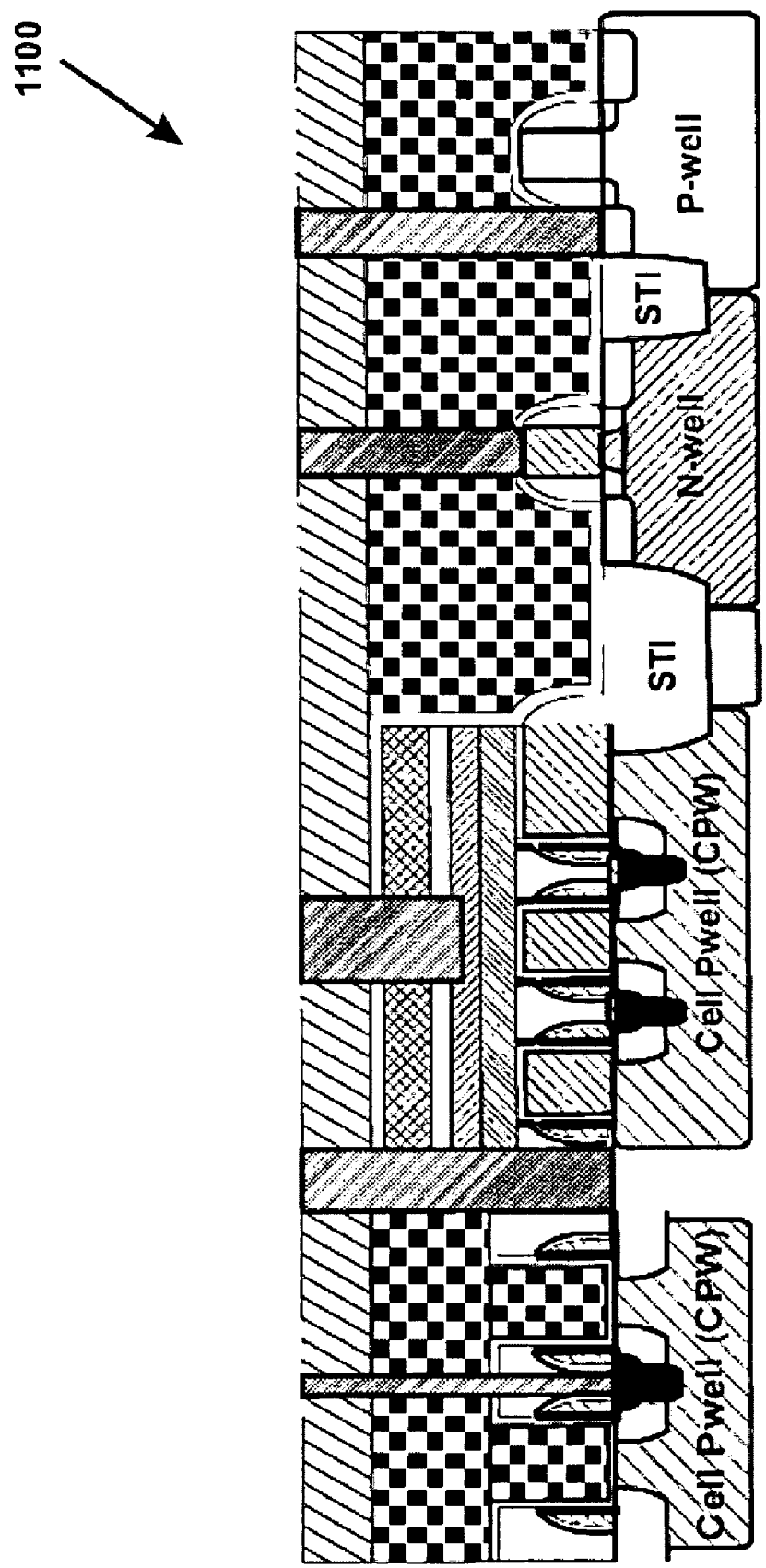
FIG. 11 is a simplified cross-sectional view diagram of a resulting structure according to an embodiment of the present invention.

FIG. 11 is a simplified cross-sectional view diagram of a resulting structure 1100 according to an embodiment of the present invention. This diagrams is merely an example, which should not unduly limit the scope of the claims herein. One of ordinary skill in the art would recognize many variations, alternatives, and modifications. As shown, the device includes memory cell region peripheral logic region. The memory cell region has a variety of elements, as shown. The peripheral cell region also includes a variety of elements as shown. Depending upon the embodiment, one of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a memory device, the method comprising a sequence of steps:
   providing a substrate comprising a surface region;
   forming well structure within the substrate, the well structure including a cell well region for a plurality of cell regions and a peripheral well region for a peripheral region;
   forming a gate dielectric layer overlying the surface region, the surface region extending over the cell well region and the peripheral well region;
   forming polysilicon film overlying the gate dielectric layer overlying the well structure;
   forming cap layer overlying the polysilicon film;
   selectively removing a portion of the cap layer overlying the cell regions to expose the polysilicon film overlying the cell regions while maintaining the cap layer on the peripheral region;
   forming a blanket nitride layer overlying the cap layer and exposed cell region;
   forming a plurality of word gates by patterning the polysilicon film in the cell region while using a portion of the nitride layer as a hard mask while exposing a portion of the surface of the substrate between each of the word gates;
   forming control gate channel implant;
   forming an oxide-on-nitride-on oxide layer overlying the word gates and exposed portion of the surface of the substrate between each of the word gates;
   forming a pair of polysilicon sidewall spacers on each word gate to form a pair of control gates while each pair of control gates is being isolated electrically from the word gate by a portion of the oxide-on-nitride-on-oxide layer, each of the control gates also being overlying a portion of the oxide-on-nitride-on oxide;
   forming cell LDD structures for each of the control gates;
   forming a buried bit line structure within a portion of the substrate for each of the LDD structures;
   forming an interlayer dielectric overlying regions within each of the word gate structures;
   protecting the cell regions; and
   processing the peripheral region while maintaining the protection on the cell region.

2. The method of claim 1 wherein the processing the peripheral region comprises:
   forming gate structures;
   forming sidewall spacer structures on the gate structures; and
   forming source/drain structures.

3. The method of claim 1 wherein the forming the interlayer dielectric comprising depositing an HDP oxide layer to fill gaps between each of the word gates to form an uneven surface overlying the memory cell region.

4. The method of claim 3 further comprising planarizing the uneven surface.

5. The method of claim 1 wherein the protecting comprises applying a photomask layer over the memory cell region.

6. The method of claim 1 wherein the gate dielectric layer is an oxide layer.

7. The method of claim 1 wherein the blanket nitride layer is formed over an entirety of the cap layer and exposed cell region.

8. The method of claim 1 wherein the buried bit line is provided using a diffusion or implantation process.

9. The method of claim 1 wherein the protecting of the cell region is provided by a masking process.

10. The method of claim 1 wherein the processing of the peripheral region comprises patterning and etching.

11. A method for forming integrated circuits, the method comprising:
    providing a substrate comprising a surface region;
    forming a cell region and a peripheral region on the surface region of the substrate;
    forming a gate dielectric layer overlying the cell region and the peripheral region;
    forming a gate layer overlying the gate dielectric layer;
    forming a protective layer overlying the peripheral region;
    forming a plurality of memory cell devices in the memory cell region, each of the memory cell device including a word gate coupled to a pair of control gates, each of the word gates having a capping layer thereon, each of the control gates having a height lower than a surface of the capping layer, wherein the forming of the plurality of memory cell devices further including forming a control gate channel implant before forming the control gates and forming cell LDD structures for each of the control gates after forming the control gates;

forming an interlayer dielectric using high density plasma overlying an entirety of the surfaces including peripheral region and cell region to a height above the surface of the capping layer;

forming a protective layer overlying the interlayer dielectric layer portion overlying the cell region while exposing the peripheral region;

removing the exposed portion of the interlayer dielectric layer in the peripheral region;

performing a chemical mechanical polishing process to remove a portion of the interlayer dielectric layer overlying the cell region;

maintaining the chemical polishing process until the capping layer on each of the gates has been exposed;

performing a wet oxide etch to substantially remove oxide on the capping layer on each of the gates;

selectively removing the capping layer from each of the word gates to expose the word gates; and forming a conductive layer overlying each of the word gates.

12. The method of claim 11 wherein the capping layer comprises a silicon nitride layer.

13. The method of claim 11 wherein the protective layer comprises a photoresist material.

14. The method of claim 11 wherein the interlayer dielectric comprises HDP oxide.

15. The method of claim 11 wherein each of the control gates comprises a separate memory device.

16. The method of claim 11 wherein the recessed region is formed using selective etching of the interlayer dielectric layer.

17. The method of claim 11 wherein each of the control gates is a spacer coupled to one of the word gates.

* * * * *